(12) United States Patent
Omori et al.

(10) Patent No.: US 8,995,486 B2
(45) Date of Patent: Mar. 31, 2015

(54) SEMICONDUCTOR LASER CONTROL DEVICE AND IMAGE FORMING DEVICE

(75) Inventors: Atsufumi Omori, Kanagawa (JP); Masaaki Ishida, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 170 days.

(21) Appl. No.: 12/881,482

(22) Filed: Sep. 14, 2010

(65) Prior Publication Data

US 2011/0064098 A1    Mar. 17, 2011

(30) Foreign Application Priority Data

Sep. 15, 2009  (JP) ................................. 2009-213727

(51) Int. Cl.
  H01S 3/00    (2006.01)
  H01S 5/042   (2006.01)
  H01S 5/40    (2006.01)
(52) U.S. Cl.
  CPC ............. H01S 5/0427 (2013.01); *H01S 5/4025* (2013.01)
  USPC .............. 372/38.01; 372/29.011; 372/29.015; 372/38.02; 372/38.07; 372/38.09
(58) Field of Classification Search
  CPC . H01S 5/0427; H01S 5/0428; H01S 5/06835; H01S 5/4025
  USPC .................. 372/29.011, 29.015, 38.01, 38.07, 372/38.09, 38.02
  See application file for complete search history.

(56) References Cited

U.S. PATENT DOCUMENTS

| | | | |
|---|---|---|---|
| 4,305,047 A | * | 12/1981 | Chapman et al. .......... 372/46.01 |
| 5,123,024 A | * | 6/1992 | Dowd et al. .............. 372/29.015 |
| 5,138,623 A | | 8/1992 | Ema et al. |
| 5,258,780 A | | 11/1993 | Ema et al. |
| 5,946,334 A | | 8/1999 | Ema et al. |
| 6,498,617 B1 | | 12/2002 | Ishida et al. |
| 6,731,317 B2 | | 5/2004 | Ema et al. |
| 6,791,596 B2 | | 9/2004 | Nihei et al. |
| 6,917,639 B2 | | 7/2005 | Ishida et al. |
| 6,927,789 B2 | | 8/2005 | Ozasa et al. |
| 6,933,957 B2 | | 8/2005 | Omori et al. |
| 7,009,430 B2 | | 3/2006 | Nihei et al. |
| 7,193,480 B2 | | 3/2007 | Ishida et al. |

(Continued)

FOREIGN PATENT DOCUMENTS

| | | |
|---|---|---|
| JP | 4-359479 | 12/1992 |
| JP | 5-121805 | 5/1993 |

(Continued)

OTHER PUBLICATIONS

English translation of JP 2008-233115.*

(Continued)

*Primary Examiner* — Tod T Van Roy

(74) *Attorney, Agent, or Firm* — Cooper & Dunham LLP

(57) ABSTRACT

There provided is a semiconductor laser control device which including plural light sources that are configured with eight or more semiconductor laser elements, a one detecting section that detects a light power of the light sources, a light power control unit that compares a signal according to a light power detected by the detecting section with a control signal corresponding to a predetermined light power to control a current supplied to the light sources, and a voltage clamp circuit that functions as an overvoltage preventing means for the detecting section when turning on each of the light sources to perform light power control.

10 Claims, 9 Drawing Sheets

(56) References Cited

U.S. PATENT DOCUMENTS

| | | |
|---|---|---|
| 7,212,224 B2 | 5/2007 | Nihei et al. |
| 7,256,815 B2 | 8/2007 | Suzuki et al. |
| 7,271,824 B2 | 9/2007 | Omori et al. |
| 7,283,151 B2 | 10/2007 | Nihei et al. |
| 7,327,379 B2 | 2/2008 | Nihei et al. |
| 7,463,278 B2 | 12/2008 | Ozasa et al. |
| 7,496,121 B2 | 2/2009 | Ishida et al. |
| 7,515,170 B2 | 4/2009 | Omori et al. |
| 7,528,625 B2 | 5/2009 | Ozasa et al. |
| 7,701,480 B2 | 4/2010 | Omori et al. |
| 2005/0089069 A1 | 4/2005 | Ozasa et al. |
| 2005/0219354 A1 | 10/2005 | Omori et al. |
| 2006/0285186 A1 | 12/2006 | Ishida et al. |
| 2007/0030548 A1 | 2/2007 | Nihei et al. |
| 2007/0047602 A1* | 3/2007 | Tanaka et al. ............ 372/29.014 |
| 2007/0132828 A1 | 6/2007 | Ishida et al. |
| 2007/0291807 A1* | 12/2007 | Uesaka ..................... 372/38.04 |
| 2008/0088893 A1 | 4/2008 | Ishida et al. |
| 2008/0123160 A1 | 5/2008 | Omori et al. |
| 2008/0218813 A1 | 9/2008 | Tanabe et al. |
| 2008/0239336 A1 | 10/2008 | Tanabe et al. |
| 2008/0267663 A1 | 10/2008 | Ichii et al. |
| 2008/0291259 A1 | 11/2008 | Nihei et al. |
| 2008/0298842 A1 | 12/2008 | Ishida et al. |
| 2009/0091805 A1 | 4/2009 | Tanabe et al. |
| 2009/0167837 A1 | 7/2009 | Ishida et al. |
| 2009/0174915 A1 | 7/2009 | Nihei et al. |
| 2009/0195635 A1 | 8/2009 | Ishida et al. |
| 2009/0231656 A1 | 9/2009 | Suzuki et al. |
| 2009/0303451 A1 | 12/2009 | Miyake et al. |
| 2010/0045767 A1 | 2/2010 | Nihei et al. |
| 2010/0119262 A1 | 5/2010 | Omori et al. |
| 2010/0214637 A1 | 8/2010 | Nihei et al. |

FOREIGN PATENT DOCUMENTS

| | | |
|---|---|---|
| JP | 2744043 | 2/1998 |
| JP | 11-298079 | 10/1999 |
| JP | 3503301 | 12/2003 |
| JP | 2008-233115 | 10/2008 |

OTHER PUBLICATIONS

Japanese official action dated Jun. 25, 2013 in corresponding Japanese patent application No. 2009-213727.

* cited by examiner

SEMICONDUCTOR LASER CONTROL DEVICE AND IMAGE FORMING DEVICE

CROSS-REFERENCE TO RELATED APPLICATIONS

The present application claims priority to and incorporates by reference the entire contents of Japanese Patent Application No. 2009-213727 filed in Japan on Sep. 15, 2009.

BACKGROUND OF THE INVENTION

1. Field of the Invention

The present invention relates to a semiconductor laser control device that is applied to an optical scanning device used in a writing system such as a digital copy machine and a laser printer and an image forming device using the same, and more particularly, to a semiconductor laser control device of a multi-beam scanning type and an image forming device in which an image is formed at a high speed by scanning plural light beams at the same time.

2. Description of the Related Art

An example of an image forming device with a conventional semiconductor laser control device will be described. FIG. 7 is a configuration diagram illustrating an example of a typical image forming device such as a laser printer and a digital copy machine using an electronic photography process. In FIG. 7, laser light emitted from a semiconductor laser unit 1009 as a light source is deflected by a polygon mirror 1003 that rotates, and forms an optical spot on a photoreceptor 1001 as a scanned medium through a scanning lens (fθ lens) 1002. The photoreceptor 1001 is exposed by the optical spot, so that an electrostatic latent image is formed.

At this time, a phase locked loop (PLL) circuit 1006 sets a modulation signal generated by a clock generating circuit 1005 to a phase synchronized with a photodetector 1004 that detects laser light deflected by the polygon mirror 1003. That is, the PLL circuit 1006 generates an image clock (a pixel clock) whose phase is synchronized with an output signal of the photodetector 1004 for each line and supplies the image clock to an image processing unit 1007 and a laser driving circuit 1008.

The semiconductor laser unit 1009 controls a light emitting time of a semiconductor laser through the laser driving circuit 1008 to form a predetermined electrostatic latent image on the photoreceptor 1001 that is a scanned medium, based on image data generated by the image processing unit 1007 and the image clock whose phase is set for each line by the PLL circuit 1006.

In recent years, in order to satisfy demands for high-speed printing and high-quality image, speeding up a polygon motor that is an optical deflector or a pixel clock that is a reference clock of laser modulation has been attempted. However, speeding up the polygon motor or the pixel clock is approaching a limit, and thus it is difficult to further enhance printing speed or image quality.

In order to solve the problem, an image forming device in which a multi-beam technique using plural light sources is employed, and a rotational speed of the polygon motor that is a deflector or a pixel clock frequency can be reduced by increasing beams of light that can be deflected at the same time, leading to high-speed and stable optical scanning and image formation has been known.

As a light source that configures a multi-beam, a laser semiconductor is used. Specially, as a light source that configures a multi-beam, a technique that combines single-beam laser chips or a technique using a laser diode (LD) array (for example, a surface-emitting laser array) in which plural light-emitting elements are assembled in a single laser chip has been known.

A semiconductor laser such as the LD array (for example, the surface-emitting laser array) is very small-sized and can perform direct modulation at a high speed by a driving current, and thus it is recently widely used as a light source of a laser printer.

However, since a relationship between the driving current and the light output of the semiconductor laser greatly varies depending on a temperature, it is problematic when desiring to set light intensity of the semiconductor laser to a desired value. In order to solve the problem and enhance a merit of the semiconductor laser, various automatic power control (APC) circuits have been suggested (for example, Japanese Patent Application Laid-open No. H11-298079, Japanese Patent Application Laid-open No. H02-205086, and Japanese Patent Application Laid-open No. H05-121805).

A variety of techniques are employed in the APC circuit. As one example, a technique that monitors a light output of the semiconductor laser through a light receiving element and controls a forward current of the semiconductor laser by an optical/electric negative feedback loop so that a light-emitting level signal can be equal to a signal which is in proportion to a monitor current proportional to the light output within a power setting time has been suggested. After the power setting time, the forward current of the semiconductor laser set within the power setting time is maintained by a sample hold circuit, the light output is set to a desired value, and the forward current is modulated based on the modulation signal, thereby turning on or off the semiconductor laser according to the modulation signal.

In this technique, modulation of the semiconductor laser can be performed at a high speed, but since the light output of the semiconductor laser is not always controlled, the light output may easily vary due to disturbance. As disturbance, there is a Do-loop characteristic, which causes an error of several % in the light output. A technique of solving the problem is disclosed in Japanese Patent Application Laid-open No. H02-205086.

Further, in Japanese Patent Application Laid-open No. H05-121805, disclosed is an example in which when controlling light-emitting power of a laser, a light-emitting state of a laser is monitored by a light receiving element, a monitor current of the light receiving element is converted into a voltage signal as an output signal by a current-voltage converting circuit, the output signal is fed back to a laser driving circuit (a laser driving control circuit) to perform control so that a laser is emitted with appropriate power, thereby compensating waveform deformation of the output signal of the photodiode.

In a multi-beam configuration, it is necessary to perform light power correction on each of plural laser light sources. That is, a light detector that detects the quantity of light emitted from plural laser light sources is required. A light detector employs a technique in which light-emitting control is performed based on a detection signal corresponding to a light beam incident with a light-emitting time interval between light sources by using a one light detector to which all multi-beam light sources can be incident.

However, in the multi-beam configuration, compared to a configuration having a one light source, the quantity of light incident to the light detector increases as much as the number of multi-beam light sources. If the quantity of incident light increases, a detection level of the detector also increases, and thus it is difficult to set light intensity of the semiconductor laser to a predetermined value.

Further, when the quantity of light equal to or more than a predetermined level is incident to the light detector, a signal level of the light detector may increase and thus exceed a control level of a light power control circuit.

In order to cope with the problems, a device that adjusts the quantity of light using a light power detecting means for detecting a sum of light quantities of plural light beams was suggested (for example, see Japanese Patent No. 3503301). Since the device performs light power adjustment based on a sum of light quantities of plural light beams, it is difficult to control the light power of each light source with high degree of accuracy, and since plural light power detection patterns are required, it takes a long time to detect the light power.

Further, since it is necessary to control plural lighting patterns of plural light sources, a circuit configuration is complicated.

A configuration example of a conventional semiconductor laser control device is illustrated in FIGS. 9 to 12. As illustrated in FIG. 9, a semiconductor laser control device includes a single semiconductor laser (LD) 10, a photodiode (PD) 20 that detects the light power of the LD 10, a variable resistor VR30 and a resistor R40 that convert a detection current of the PD 20 to a voltage, an analog-digital converter (ADC) 50 that performs analog-to-digital (A/D) conversion on the detection signal (a voltage converted from a detection current by the variable resistor VR40 and the resistor R40) of the PD 20, a central processing unit (CPU) 60 that generates a light-emitting current control signal of the LD 10 based on an output of the ADC 50, a digital-analog converter (DAC) 70 that performs digital-to-analog (D/A) conversion on the light-emitting current control signal from the CPU 60, and a current source 80 that supplies the LD 10 with a driving current based on an output value of the DAC 70.

According to the semiconductor laser control device illustrated in FIG. 9, the detection current according to a light-emitting level of the LD 10 flows through the PD 20 and is fed back to the LD 10 through the ADC 50, the CPU 60, and the DAC 70 based on a detection voltage proportional to the detection current to thereby control the light-emitting level of the LD 10. Since the detection current of the PD 20 is proportional to the light-emitting level of the LD 10, a detection voltage level to the ADC 50 can be adjusted by changing a resistance value of the variable resistor VR30.

FIG. 10 illustrates an example in which the semiconductor laser control device illustrated in FIG. 9 has plural light sources (four light sources in FIG. 10). The semiconductor laser control device illustrated in FIG. 9 has a single light source, and thus a light power range detected by the PD 20 is equal to a light power range of a one LD. In the semiconductor laser control device illustrated in FIG. 10, when four light sources LD11, LD12, LD13, and LD14 emit light at the same time, a range of the light power detected by the PD 20 is four times of the light power range of a one LD. For example, when light-emitting control is performed within a range of 0.5 mW to 2 mW per one LD, the light power varies within a range of 0.5 mW to 8 mW.

FIG. 11 illustrates an example in which a light power control circuit which including the ADC 50, the CPU 60, and the DAC 70 in the semiconductor laser control devices illustrated in FIGS. 9 and 10 is configured with an analog/digital sample hold circuit.

In the configuration illustrated in FIG. 11, if it is assumed that a power source voltage VCC 90 is 5V and a detection voltage input to the ADC 50 is 3V, when one LD emits light, a desired voltage 3V is obtained, but when all of four LDs emit light at the same time, since all of light is incident to the PD 20, it is difficult to obtain a desired detection voltage.

In this case, when a voltage of the resistor R40 is constant, the detection voltage 12V is theoretically four times of one ch, but actually it does not exceed the source voltage VCC due to an operation of the PD 20 or a protection diode of the ADC 50. This may cause the PD 20 to deteriorate or an input portion of the ADC 50 to deteriorate or get damaged.

A semiconductor laser control device having a configuration for protecting an overvoltage has been known (for example, see Japanese Patent Application Laid-open No. 2008-233115). FIG. 12 illustrates an example of a semiconductor laser control device disclosed in Japanese Patent Application Laid-open No. 2008-233115. The semiconductor laser control device of FIG. 12 prevents an overvoltage by connecting a zener diode 200 to a voltage detecting terminal. A zener voltage is set to, for example, 4V to prevent the voltage detecting terminal from having a voltage equal to or more than 4V, thereby protecting the ADC 50 and the PD 20. Further, by setting a reverse voltage of the PD 20 to 1V or more, a characteristic is stabilized, and the PD 20 is prevented from having a reverse voltage.

In the case of using the zener diode, when it transitions from a state in which plural light sources are turned on to a state in which only one light source is turned on, it takes a time until a level of the detection signal of the PD 20 is stabilized. For example, in the case of a multi-beam configuration in which each of 10 light sources is turned on at 1 mW, a time constant increases, and a response time is about 50 μs.

Further, "a state in which plural light sources are turned on" represents a state in which plural light sources are turned on to perform image data writing within an effective image area. "A state in which only one light source is turned on" represents a state in which a light source is turned on one by one to perform APC control on each light source.

A configuring using the zener diode is large in time constant as described above. Therefore, a light power detecting time per one light source may be shortened, and it may be insufficient in an image forming device requiring high-speed and high degree of accuracy.

As described above, the reason why it takes a time until the light power is stabilized is because of a saturation phenomenon of the PD. The saturation phenomenon of the PD will be described with reference to the drawing. FIG. 13 illustrates a configuration example of a light detector using the PD. In FIG. 13, when light is incident to the PD, a PD current ipd, which depends on the quantity of light incident to the PD and efficiency of the PD, flows through a resistor Rpd. The PD detects light through the resistor Rpd, so that the current ipd is converted to a voltage as an output voltage Vout. Adjusting the light power of the light source is performed through a control circuit (not shown) in response to the output voltage.

In FIG. 13, VCC is a power source voltage of the PD, and a voltage applied to the PD is represented by a reverse voltage Vpd. The reverse voltage Vpd has a value obtained by subtracting VCC from the output voltage Vout, that is, VPD=VCC−Vout.

Since light receiving sensitivity of a general PD is about 0.5 (A/W), in order to adjust the light power with high degree of accuracy through a light power control circuit, it is necessary to increase the output voltage Vout that is a control voltage. For this reason, the resistor Rpd having a very large resistance of about 1 kΩ to 100 kΩ is used.

For example, when light receiving sensitivity of the PD is 0.5 (A/W), the control voltage required for light power control is equal to or more than 1V, and a light receiving quantity of the light detector is 2 mW, the resistor Rpd having a resistance equal to or more than 1 kΩ is required. Since the output voltage Vout as the control voltage is decided by the current and the resistor of the PD, the reverse voltage is "VCC−ipd×Rpd". Therefore, in order to maintain the reverse voltage Vpd, the current ipd and the resistor Rpd of the PD preferably have a small value.

Next, a relationship between a level of a light pulse incident to the PD and an output voltage corresponding thereto is illustrated in FIGS. 14A and 14B. As illustrated in FIG. 14A, since an output voltage Vout1 generated by an incident light pulse P1 incident to the PD is lower than the power source voltage Vcc, the reverse voltage Vpd is secured, and it is possible to vary the output voltage Vout following ON-OFF of the light pulse P1.

However, as illustrated in FIG. 14B, when an output voltage Vout2 generated by an incident light pulse P2 incident to the PD is almost equal to the power source voltage Vcc, since the reverse voltage Vpd decreases and so the PD is saturated, even after the incident light pulse P2 becomes OFF, the output voltage Vout2 does not respond immediately and is attenuated after a delay time td elapses.

FIG. 15 is a graph illustrating a relationship between the number of light sources emitting light incident to the PD and the delay time td. In FIG. 15, a horizontal axis denotes the number of light sources, and a vertical axis denotes the delay time td. If Rpd is 3 kΩ, the power source voltage VCC of the PD is 5V, the light receiving sensitivity of the PD is 0.5 (A/W), the light emitting quantity of one light source is a minimum of 3 mW to a maximum of 6 mW, and the transmittance from a light source end section to the light detector in an optical system is 0.1, the light power incident to the light detector is 0.3 mW to 0.6 mW.

In this condition, when the number of light sources is 8, the quantity of light incident to the PD as a minimum light power is 2.4 mW (0.3×8). At this time, since the current Ipd flowing through the PD is 1.2 mA, the output voltage Vout is 3.6V. Therefore, the reverse voltage is 1.4V, and the delay time of the PD signal is about several microseconds (μs).

Meanwhile, in the case of the maximum light power, since the quantity of light incident to the PD is 4.8 mW (0.6×8) and the current Ipd flowing through the PD is 2.4 mA, the output voltage Vout is 7.2V. Therefore, the reverse voltage is not secured, and the PD becomes a saturation state. At this time, the delay time is equal to or more than 10 μs.

As described above, in an image forming device having a large number of light sources, when plural light sources are turned on, the reverse voltage of the PD decreases, and the delay time taken to recover from the saturation state increases.

Next, influence on an APC time when the PD is saturated will be described with reference to FIGS. 16A and 16B. APC stands for automatic power control and is a technique of adjusting the light power of the semiconductor laser. The APC time represents a time for adjusting the light power of the semiconductor laser.

FIG. 16A illustrates an example of a relationship among a synchronization signal, an image signal, an output voltage Vout, an APC signal in a copy machine. The synchronization signal of FIG. 16A represents a synchronization signal detected by the photodetector 1004 of FIG. 7. The image signal represents a light power signal of a light beam scanned on the photoreceptor 1001. The output voltage Vout may be detected by a front monitor method in which part of a light beam emitted from the semiconductor laser unit 1009 is reflected, for example, in a beam emitting direction to be guided to the light detector or detected using a back monitor PD mounted inside the laser unit. Since beams of all light sources are incident to the PD, as the number of light sources increases, the quantity of incident light also increases.

The APC signal is a timing signal for performing light power adjustment of a light source between an end of an image area and a next synchronization signal detected by the photodetector 1004.

In the past, the number of light sources based on the semiconductor laser used in a copy machine was about 4 at most. If a monitor current per one light source is a maximum of 0.8 mA, the monitor current of four light sources is a maximum of 3.2 mA. At this time, when the PD resistor Rpd is 1 kΩ and the power source voltage VCC is 5V, the reverse voltage is 1.8V. Therefore, even though the light power is large, the APC time can be secured without saturation of the PD.

FIG. 16A illustrates an example in which the PD is not saturated, for example, the case in which writing is performed by four light sources. Even when the image signal is in an ON state within an effective scanning area, the output voltage Vout responds to the image signal without any delay, and thus becomes an OFF state when the effective scanning area ends, so that a time until a next synchronization signal will come in from after the effective scanning area ends, that is, an APC allowable time tapc1 can be secured. Therefore, in a conventional system having about 4 light sources, saturation of the PD is not problematic.

FIG. 16B illustrates an example in which the PD is saturated. Particularly, FIG. 16B illustrates an example in which writing is performed by eight light sources. When the number of light sources is equal to or more than eight, high-speed printing can be performed. However, in this case, since the light power in the effective scanning area greatly increases when all of the light sources are turned on, as described above, the reverse voltage Vpd of the PD decreases, the PD is saturated, and the response to the incident light is delayed.

That is, even though the effective scanning area of the image signal ends, the output voltage Vout is not attenuated and decreases after a predetermined delay time elapses. In this case, a time until the next synchronization signal comes in from after the effective scanning area ends does not become the APC allowable time, but a time until the next synchronization signal comes in from after the output voltage Vout decreases becomes the APC allowable time.

If the output voltage Vout is delayed from the image signal and attenuated as described above, the APC allowable time tapc2 is very shortened, and it is difficult to perform APC control in plural light sources with high degree of accuracy.

Further, in the case of increasing the PD resistor Rpd in order to perform APC control with high degree of accuracy when one light source is turned on, if the light power is large in the effective scanning area when all of the light sources are turned on, the reverse voltage of the PD becomes close to 0V, and the PD is saturated.

In order to turn on one light source to adjust the light power after the PD is saturated, it is necessary to wait until saturation is settled. A delay time until saturation is settled is, for example, about tens of microseconds (μs). Since the APC allowable time is narrowed due to the delay time, the APC allowable time tapc2 becomes shorter than the APC allowable time tapc1 when the PD is not saturated.

When APC is impossible between an end of the effective scanning area and front end synchronization, it is impossible to adjust the light power within an image printing time, and there occurs a problem in light power stability within the image area. Since a time until recovered from after the PD is saturated is proportional to the incident light power, as the number of light sources increases, it is disadvantageous.

SUMMARY OF THE INVENTION

It is an object of the present invention to at least partially solve the problems in the conventional technology.

According to an aspect of the present invention, there is provided a semiconductor laser control device, including: a plurality of light sources that is configured with eight or more semiconductor laser elements; a one detecting section that detects a light power of the light sources; a light power control unit that compares a signal according to a light power detected by the detecting section with a control signal corresponding to a predetermined light power to control a current supplied to the light sources; and a voltage clamp circuit that functions as an overvoltage preventing means for the detecting section when turning on each of the light sources to perform light power control.

According to another aspect of the present invention, there is provided an optical scanning device including a semiconductor laser control device, wherein the semiconductor laser control device further includes, a plurality of light sources that is configured with eight or more semiconductor laser elements; a one detecting section that detects a light power of the light sources; a light power control unit that compares a signal according to a light power detected by the detecting section with a control signal corresponding to a predetermined light power to control a current supplied to the light sources; and a voltage clamp circuit that functions as an overvoltage preventing means for the detecting section when turning on each of the light sources to perform light power control.

According to another aspect of the present invention, there is provided an image forming device including an optical scanning device, wherein the optical scanning device further includes, a plurality of light sources that is configured with eight or more semiconductor laser elements; a one detecting section that detects a light power of the light sources; a light power control unit that compares a signal according to a light power detected by the detecting section with a control signal corresponding to a predetermined light power to control a current supplied to the light sources; and a voltage clamp circuit that functions as an overvoltage preventing means for the detecting section when turning on each of the light sources to perform light power control.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
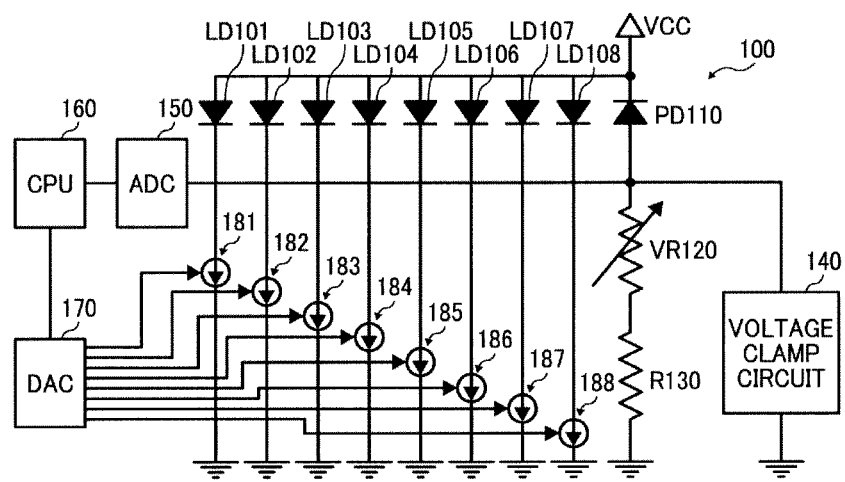
FIG. 1 is a circuit diagram illustrating an example of a semiconductor laser control device according to the invention.

Hereinafter, embodiments of a semiconductor laser control device and an image forming device according to the invention will be described with reference to the accompanying drawings. In FIG. 1, a semiconductor laser control device 100 includes plural LDs 101 to 108, a PD 110 that detects the quantity of light emitted from the LDs 101 to 108, a variable resistor VR120 and a resistor R130 that are detecting resistors for converting a detection current of the PD 110 into a detection voltage, a voltage clamp circuit 140, an ADC 150 that performs analog-to-digital conversion on a detecting signal, a CPU 160 that computes an output signal of the ADC 150 and generates a light-emitting current control signal of the LDs 101 to 108, a DAC 170 that perform digital-to-analog conversion on the light-emitting current control signal from the CPU 160, and current sources 181 to 188 that provide the LDs 101 to 108 with driving currents based on an output value of the DAC 170.

When the LDs 101 to 108 emit light, the light is incident to the PD 110. A current corresponding to the quantity of light flows through the variable resistor VR120 and the resistor R130 and is converted into a voltage as an output voltage Vout. The variable resistor VR120 is used to adjust a range that the output voltage changes due to efficiency of a laser or variation of a light receiving element.

The output voltage Vout is converted to a digital value by the ADC 150 and compared with a control signal representing a desired light power in the CPU 160. A comparison process result is converted to an analog signal by the DAC 170 to decide current values of the current sources 181 to 188 that supply currents to the LDs 101 to 108. In this way, the light power of the LDs 101 to 108 is adjusted.

The semiconductor laser control device according to the invention includes the voltage clamp circuit 140 that maintains the output voltage Vout to a predetermined value as illustrated in FIG. 1. When the LDs 101 to 108 are turned on at the same time and so the PD 110 is likely to be saturated, the voltage clamp circuit 140 maintains the output voltage Vout to a clamp voltage Vc1, thereby preventing the PD 110 from being saturated.

Accordingly, the response of the PD 110 is not delayed with respect to blinking of the LDs 101 to 108, and the APC allowable time increases, thereby providing the semiconductor laser control device in which high speed and high degree of accuracy are achieved. The voltage clamp circuit 140 may be configured with a common base circuit illustrated in FIG. 2, a common gate circuit illustrated in FIG. 3, or a diode array illustrated in FIG. 4.

Figure 2:
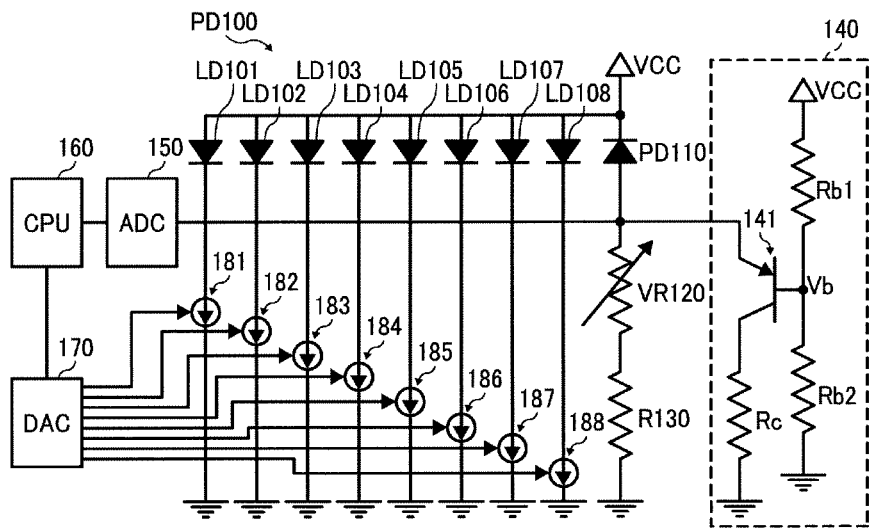
FIG. 2 is a circuit diagram illustrating another example of a semiconductor laser control device according to the invention.

FIG. 2 illustrates an example of the voltage clamp circuit 140 based on the common base circuit. When a restriction voltage Vc1 (which is also called a clamp voltage Vc1) of the output voltage Vout is set, Vb+Vbe obtained by adding a voltage Vbe between a base and an emitter of a transistor to a base potential can be restricted as a maximum voltage of Vout by controlling the base potential of the transistor. That is, when the quantity of light incident to the PD 110 increases and so Vout becomes the clamp voltage Vc1 decided by Vb+Vbe, since the transistor is turned on and so a current flowing from the PD 110 flows through the transistor, Vout does not exceed Vc1.

When the light power changes from when eight light sources are turned on to when one light source is turned on by the above-described operation, an operation of the voltage clamp circuit 140 is turned off, and Vout can respond at a high speed. Thus, when one light source is turned on, the output voltage Vout immediately becomes stable, and a light power control time (the APC allowable time) increases, so that light power control can be performed at high degree of accuracy.

Further, a bipolar transistor is used as a transistor for use in the common base circuit. Thus, a high-speed operation can be performed with high degree of certainty, and a recovery time from the PD saturation state can be shortened.

Further, the clamp voltage can be set by voltage division of resistors Rb1 and Rb2 for deciding the base potential Vb of FIG. 2. The clamp voltage Vc1 can be adjusted by configuring one of the resistors Rb1 and Rb2 with a variable resistor.

Further, when the voltage clamp circuit is configured with the common gate circuit, since an operation speed depends on the response of the transistor, it is preferable to select a transistor that responds at as high speed as possible.

Figure 3:
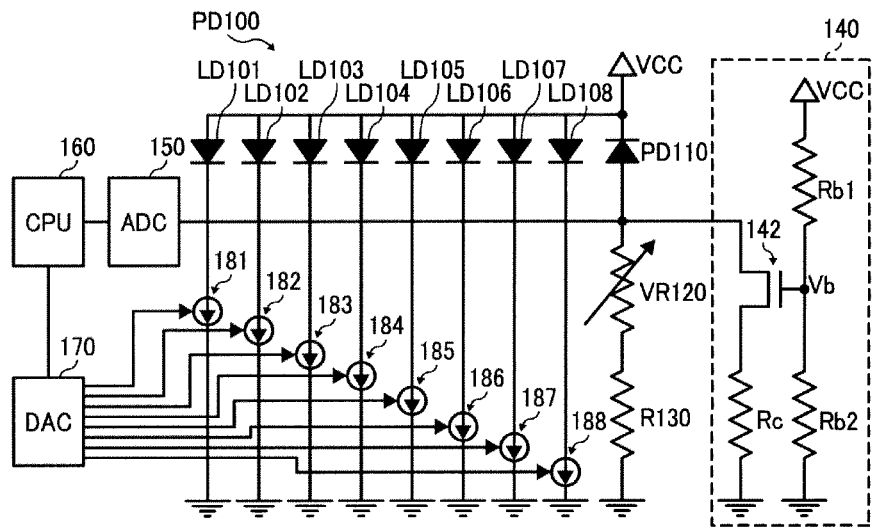
FIG. 3 is a circuit diagram illustrating another example of a semiconductor laser control device according to the invention.

Next, an embodiment in which the voltage clamp circuit 140 is configured with the common gate circuit is illustrated in FIG. 3. An operation principle is similar to the common base circuit. Further, in the case of the common base circuit using the bipolar transistor, it serves as an inverse transistor, and thus leakage current flows. For this reason, a voltage clamp circuit that can operate without leakage current can be implemented by using a MOS-FET transistor as the common base circuit. Further, since there is no influence of leakage current, the light power can be adjusted with high degree of accuracy.

Figure 4:
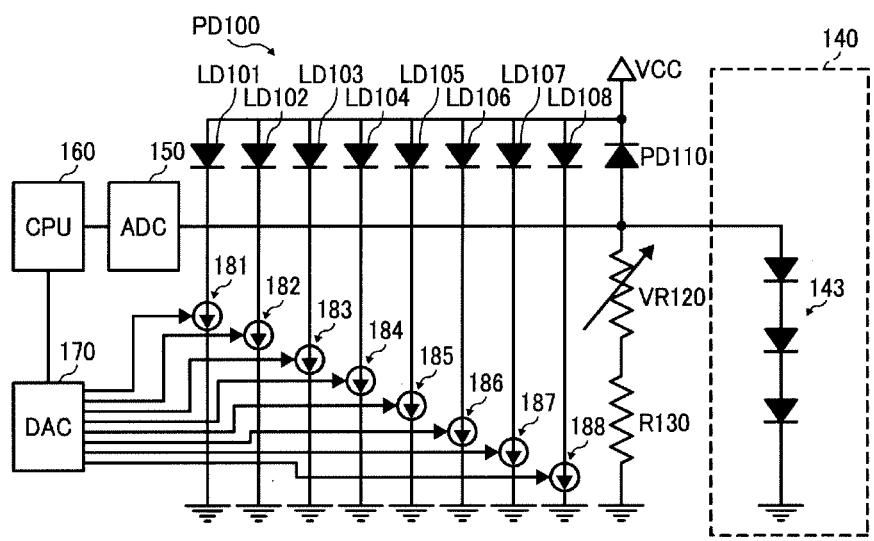
FIG. 4 is a circuit diagram illustrating another example of a semiconductor laser control device according to the invention.

Next, an embodiment in which the voltage clamp circuit 140 is configured with a diode array is illustrated in FIG. 4. As illustrated in FIG. 4, in a diode array 143 composed of diodes connected in series, when Vout is higher than a sum of forward voltages of the diodes, current flows to the diode side. Thus, a predetermined value is set as the clamp voltage Vc1 so that the output voltage Vout does not exceed the predetermined value.

According to the circuit illustrated in FIG. 4, even when the light power changes from when eight light sources are turned on to when one light source is turned on, the diode array 143 becomes an operation OFF state, and so Vpd can respond at a high speed. Thus, it is immediately stabilized to a voltage at a time when one light source is turned on, and a light power control time increases, whereby light power control can be performed with high degree of accuracy.

Further, the clamp voltage Vc1 can be set to a predetermined value by adjusting a forward voltage of a diode or the number of diodes connected in series.

Figure 5:
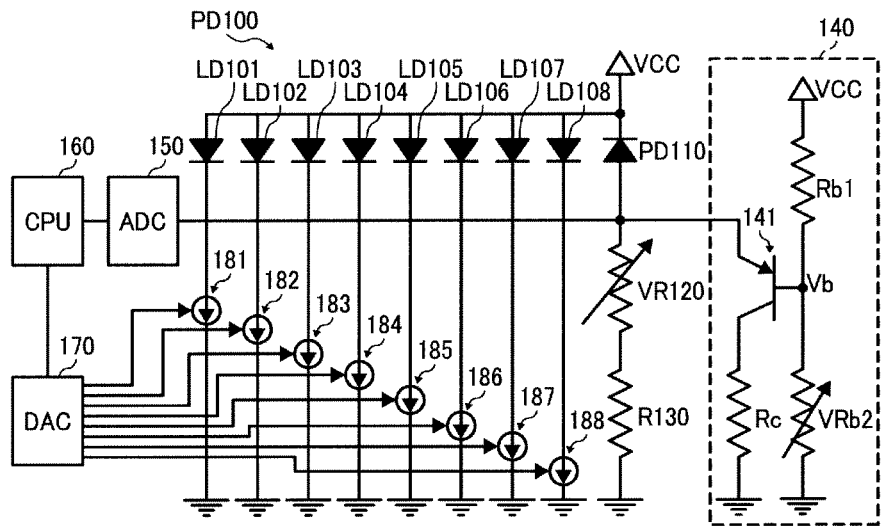
FIG. 5 is a circuit diagram illustrating another example of a semiconductor laser control device according to the invention.

Further, another embodiment in which the voltage clamp circuit 140 is configured with the common base circuit will be described with reference to FIG. 5. FIG. 5 illustrates an example using resistor voltage division by a resistor Rb1 and a variable resistor VRb1 as a method of deciding the clamp voltage Vc1 of the voltage clamp circuit 140. In the present embodiment, the clamp voltage Vc1 can be varied by adjusting a value of the variable resistor VRb1. Thus, even when there is a variation in sensitivity of the PD, it is possible to implement a compatible voltage clamp function.

Figure 6A:
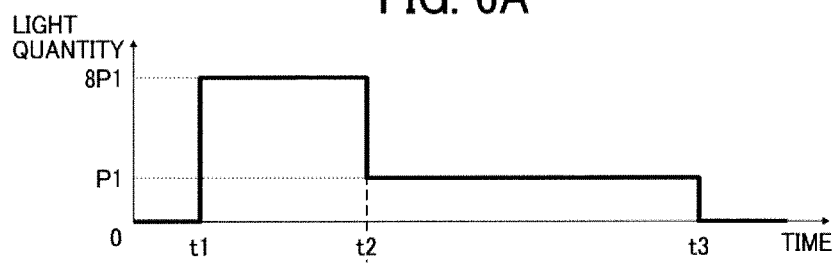
FIGS. 6A to 6D are graphs illustrating characteristic comparison between a semiconductor laser control device according to the invention and a conventional semiconductor laser control device.

Next, an operation of a semiconductor laser control device according to the invention will be described with reference to FIG. 6A to FIG. 6D by comparing with a conventional example. FIG. 6A is a graph illustrating a time change in the quantity of light incident to the PD from the light source. In the present embodiment, Rpd is 3 KΩ, a maximum of the number of light sources is 8, a light-emitting quantity per 1 CH (one light source) is 6 mW, the transmittance from a light source end section to a light detector in an optical system is 0.1, light receiving sensitivity of the PD 110 is 0.5 A/W, and a power source voltage VCC of a corresponding device is 5 V, the quantity of light incident to the PD 110 per one light source is 0.6 mW. Thus, when eight light sources are turned on, the quantity of light incident to the PD 110 is 4.8 mW. When eight light sources are turned on at a time t1, seven light sources are turned off at a time t2, one light source is in an ON state, and all of the light sources are turned off at a time t3, the light power changes as illustrated in FIG. 6A.

Figure 6B:
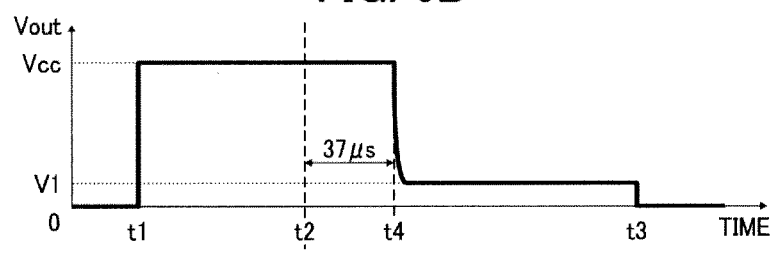
Figure 10:
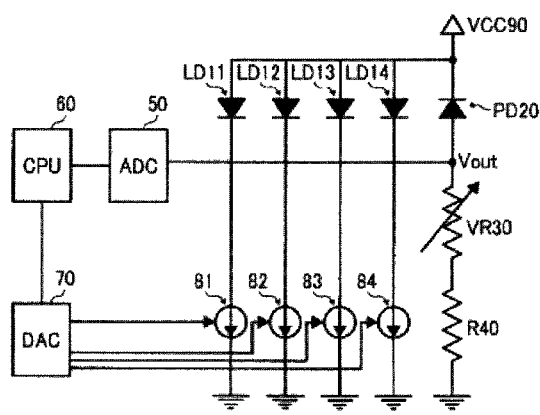
FIG. 10 is a circuit diagram illustrating an example of a conventional semiconductor laser control device.
Figure 11:
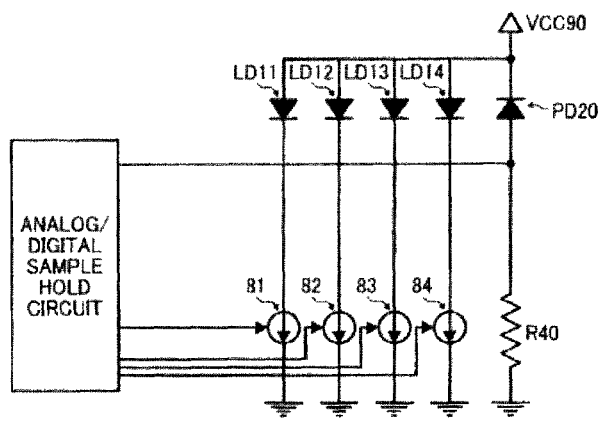
FIG. 11 is a circuit diagram illustrating another example of a conventional semiconductor laser control device.

In a semiconductor laser control device having no voltage clamp circuit as in the conventional laser control device illustrated in FIG. 10, the output voltage Vout has a lighting pattern illustrated in FIG. 6B. In this case, when one light source is turned on with a light power P1, the output voltage is 0.9V. Thus, when eight light sources are turned on, the output voltage should be 7.2V under normal circumstances. However, the output voltage has the same level as the power source voltage VCC due to restriction of the power source voltage VCC.

The output voltage Vout at this time has almost the same level as the power source voltage VCC at the time t2. Even though the lighting state changes to the one light source lighting state and the light power becomes P1, since the PD 110 is in a saturation state, the output voltage Vout cannot follow a change of the incident light power P1. In this case, after delayed until a time 4, it transitions to a voltage Vout corresponding to a light-emitting level of the incident light power P1. The delay time (t4−t2) is, for example, about 40 μs under the above-described condition.

Due to the occurrence of the delay time, a control time is restricted in performing light power control in a multi-beam writing optical scanning device.

Figure 6C:
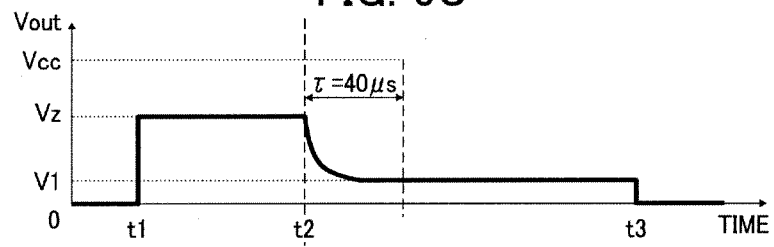
Figure 12:
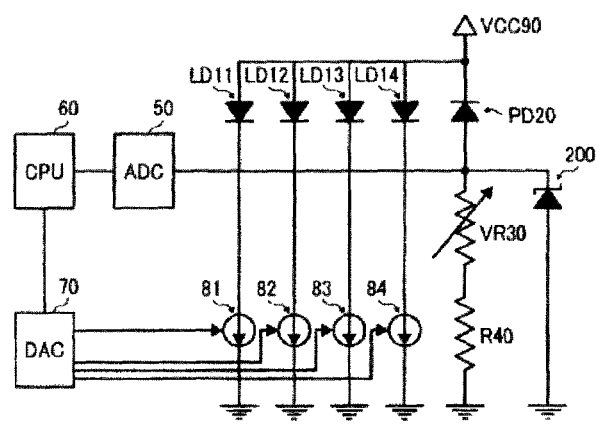
FIG. 12 is a circuit diagram illustrating another example of a conventional semiconductor laser control device.
Figure 13:
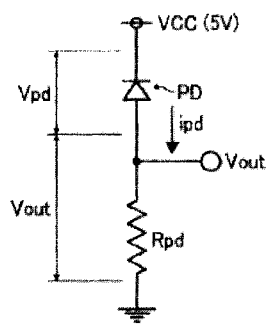
FIG. 13 is a circuit diagram for explaining an operation of a light detector of a conventional semiconductor laser control device.
Figure 14A:
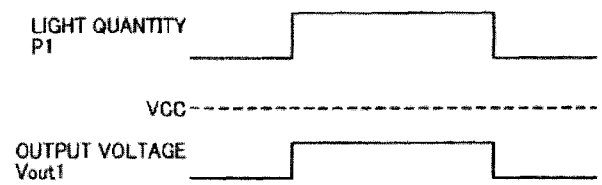
FIG. 14 is a timing chart illustrating a relationship between a level of a light pulse and an output of a light detector.
Figure 14B:
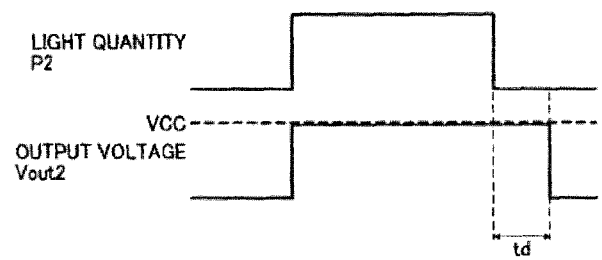
Figure 15:
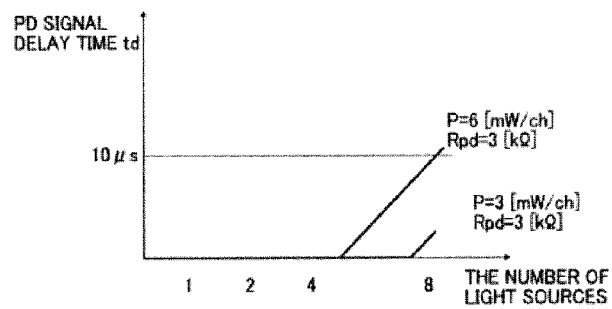
FIG. 15 is a graph illustrating a correlation between the number of light sources and a delay time of a photodiode (PD) in a conventional semiconductor laser control device.
Figure 16A:
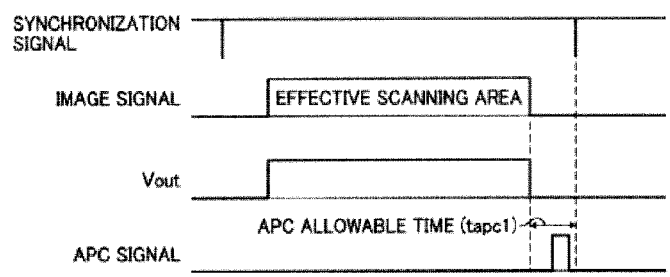
FIG. 16 is a graph illustrating a characteristic of a conventional semiconductor laser control device.
Figure 16B:
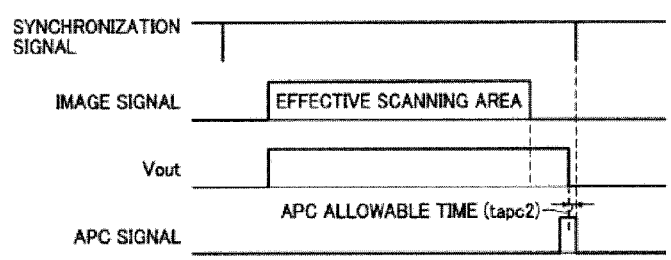

Further, in a semiconductor laser control device using a zener diode instead of the voltage clamp circuit as in the conventional semiconductor laser control device illustrated in FIG. 12, the output voltage Vout has a lighting pattern illustrated in FIG. 6C. When the zener voltage of the zener diode is set to Vz, a maximum value of the output voltage Vout is Vz.

In the case of restricting the output voltage Vout using the zener diode, since the PD does not become the saturation state, the delay time caused by the PD saturation can be reduced.

However, since the zener diode 200 has a large parasitic capacitance (about 1000 pF), a time, taken until it is stabilized to Vout corresponding to a light emitting level, per one light source is, for example, about 40 μs, and thus the APC time is restricted in performing light power control in a multi-beam writing optical scanning device.

Figure 6D:
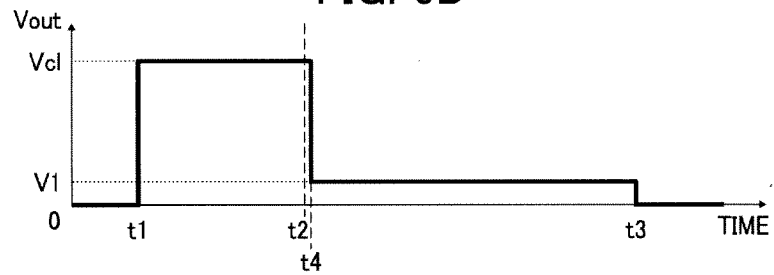
Figure 7:
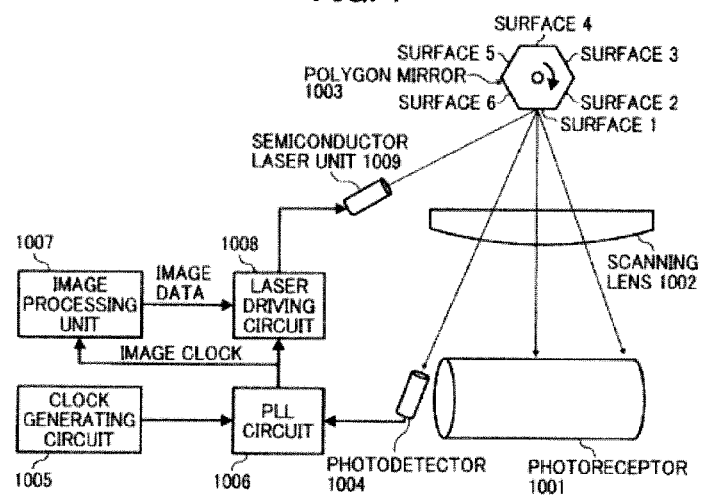
FIG. 7 is a schematic diagram illustrating a configuration example of a conventional image forming device.

FIG. 6D illustrates an operation pattern of a semiconductor laser control device according to the invention. The semiconductor laser control device according to the invention includes a voltage clamp circuit.

The clamp voltage Vc1 of the voltage clamp circuit 140 is a maximum value of the output voltage Vout, and Vout does not exceed Vc1. If the quantity of light incident to the PD has the pattern illustrated in FIG. 6A, since the PD is not saturated, it is possible to reduce the delay time caused by the PD saturation.

Further, since the parasitic capacitance is not as large as the zener diode, a time taken until it is stabilized to V1 corresponding to the light-emitting level per one light source is much shortened (for example, 0.2 μs).

Thus, the control time is not restricted when performing light power control in the multi-beam writing optical scanning device.

Figure 8:
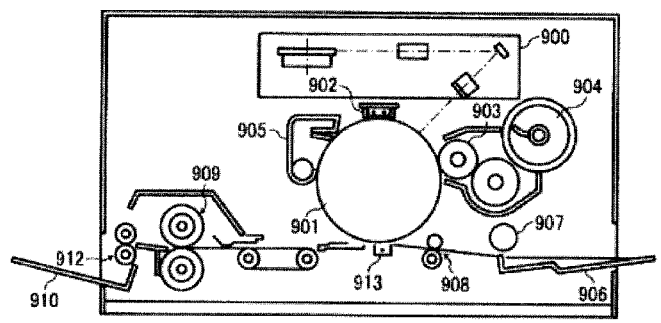
FIG. 8 is a cross-sectional configuration diagram illustrating an example of an image forming device according to the invention.
Figure 9:
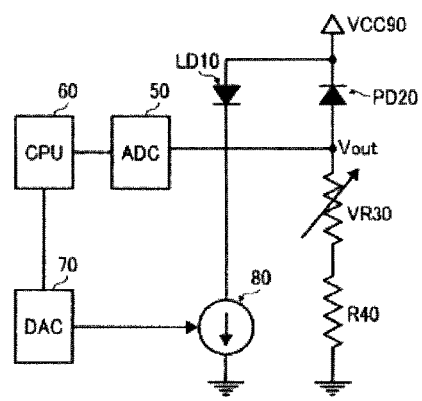
FIG. 9 is a circuit diagram illustrating an example of a conventional semiconductor laser control device.

Next, an embodiment of an image forming device to which a semiconductor laser control device according to the invention is applied will be described with reference to FIG. 8.

Around a photoreceptor drum 901 that is a scanned surface, disposed are an electrifying charger 902 that charges a photoreceptor to a high voltage, a developing roller 903 for performing development by attaching a charged toner to an electrostatic latent image written by an optical scanning device 900, a toner cartridge 904 that feeds a toner to the developing roller, and a cleaning case 905 that scrapes and accumulates the toner remaining on the drum. As described above, latent image writing is performed on each surface of the photoreceptor drum by plural lines at the same time. A recording paper is fed from a paper feed tray 906 by a paper feed roller 907 and transported by a resist roller pair 908 at a writing start timing of a sub scanning direction. The toner is transferred onto the recording paper by a transfer charger 913 when passing through the photoreceptor drum and fixed by a fixing roller 909, and then the paper is discharged to a discharge paper tray 910 by a paper discharge roller 912. When the semiconductor laser control device according to the invention is applied to the image forming device, light power control of a semiconductor laser can be performed at high degree of accuracy, whereby a high-quality image can be obtained.

According to the invention, a voltage clamp circuit is used in a detecting section of an output signal of a light receiving element (for example, a photodiode) that is a light detector. Thus, it is possible to obtain a semiconductor laser control device in which a light power adjusting time is sufficiently secured and light power control can be performed with high degree of accuracy even though light from plural light sources is incident to the light detector to increase a light power range.

Further, the semiconductor laser control device according to the invention is applied to an image forming device. Thus, it is possible to obtain an image forming device in which density variation is small, and light power control and image forming can be performed with high degree of accuracy.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser control device, comprising:
a plurality of light sources that is configured with eight or more semiconductor laser elements;
a detecting section including a photodiode that detects a light power of the light sources;
a light power control unit that compares a signal according to the light power detected by the detecting section with a control signal corresponding to a predetermined light power to control a current supplied to the light sources, the plurality of light sources being controlled independently from each other by the light power control unit;
a voltage clamp circuit including a bipolar transistor having a base or a field effect transistor having a gate, the transistor being connected to a terminal of the photodiode, and
a first resistor and second resistor connected serially to each other between a bias voltage and ground, the base or gate of the transistor being connected to a junction between the first and second resistor, and
wherein a predetermined voltage is applied at the base or gate of the transistor to allow a current to flow from the terminal of the photodiode through the transistor when a voltage of the terminal reaches a clamp voltage, so as to prevent the voltage of the terminal from exceeding the clamp voltage,
wherein the clamp voltage is chosen to avoid the photodiode entering a saturation state that causes a delay in detecting a change in the light power of one or more of the independently controlled light sources.

2. The semiconductor laser control device according to claim 1, further comprising a clamp voltage adjusting circuit that adjusts the clamp voltage of the voltage clamp circuit.

3. The semiconductor laser control device according to claim 1, wherein the control signal is applied at a voltage equal to or more than 1V.

4. The semiconductor laser control device according to claim 1, wherein in a case that an on-off state of the light sources changes from a first state in which more than one of the light sources are on, to a second state in which only one of the light sources is on, the voltage clamp circuit reduces an amount of time for an output voltage corresponding to the detected light power to reach a second output voltage corresponding to the second state.

5. The semiconductor laser control device according to claim 1, wherein the clamp voltage is lower than a power source voltage of the semiconductor laser control device.

6. The semiconductor laser control device according to claim 1, wherein the terminal of the photodiode is an anode of the photodiode.

7. The semiconductor laser control device according to claim 1, wherein the voltage clamp circuit is configured with the bipolar transistor as a common base circuit.

8. The semiconductor laser control device according to claim 1, wherein the voltage clamp circuit is configured with the field effect transistor as a common gate circuit.

9. An optical scanning device comprising:
a semiconductor laser control device including:
a plurality of light sources that is configured with eight or more semiconductor laser elements;
a detecting section including a photodiode that detects a light power of the light sources;
a light power control unit that compares a signal according to the light power detected by the detecting section with a control signal corresponding to a predetermined light power to control a current supplied to the light sources, the plurality of light sources being controlled independently from each other by the light power control unit;

a voltage clamp circuit including a bipolar transistor having a base or a field effect transistor having a gate, the transistor being connected to a terminal of the photodiode; and a first resistor and second resistor connected serially to each other between a bias voltage and ground, the base or gate of the transistor being connected to a junction between the first and second resistor, and wherein a predetermined voltage is applied at the base or gate of the transistor to allow a current to flow from the terminal of the photodiode through the transistor when a voltage of the terminal reaches a clamp voltage, so as to prevent the voltage of the terminal from exceeding the clamp voltage, wherein the clamp voltage is chosen to avoid the photodiode entering a saturation state that causes a delay in detecting a change in the light power of one or more of the independently controlled light sources.

10. An image forming device comprising:

an optical scanning device including:

a plurality of light sources that is configured with eight or more semiconductor laser elements;

a detecting section including a photodiode that detects a light power of the light sources;

a light power control unit that compares a signal according to the light power detected by the detecting section with a control signal corresponding to a predetermined light power to control a current supplied to the light sources, the plurality of light sources being controlled independently from each other by the light power control unit;

a voltage clamp circuit including a bipolar transistor having a base or a field effect transistor having a gate, the transistor being connected to a terminal of the photodiode; and a first resistor and second resistor connected serially to each other between a bias voltage and ground, the junction between the first and second resistor being connected to the base or gate of the transistor, and wherein a predetermined voltage is applied at the base or gate of the transistor to allow a current to flow from the terminal of the photodiode through the transistor when a voltage of the terminal reaches a clamp voltage, so as to prevent the voltage of the terminal from exceeding the clamp voltage, wherein the clamp voltage is chosen to avoid the photodiode entering a saturation state that causes a delay in detecting a change in the light power of one or more of the independently controlled light sources.

* * * * *